US011927689B2

(12) United States Patent
Ramalingam et al.

(10) Patent No.: US 11,927,689 B2
(45) Date of Patent: Mar. 12, 2024

(54) CFAR OS DETECTION HARDWARE WITH TWO SETS OF COMPARATORS

(71) Applicant: TEXAS INSTRUMENTS INCORPORATED, Dallas, TX (US)

(72) Inventors: Sujaata Ramalingam, Bangalore (IN); Karthik Subburaj, Bangalore (IN); Pankaj Gupta, Dausa (IN); Anil Varghese Mani, Bangalore (IN); Karthik Ramasubramanian, Bangalore (IN); Indu Prathapan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 106 days.

(21) Appl. No.: 17/351,750

(22) Filed: Jun. 18, 2021

(65) Prior Publication Data

US 2022/0155368 A1 May 19, 2022

(30) Foreign Application Priority Data

Nov. 17, 2020 (IN) .............................. 202041049954

(51) Int. Cl.
*G01S 7/292* (2006.01)
*G01S 7/40* (2006.01)
*G01S 13/524* (2006.01)

(52) U.S. Cl.
CPC .......... *G01S 7/2922* (2013.01); *G01S 7/4004* (2013.01); *G01S 13/5246* (2013.01)

(58) Field of Classification Search
CPC .. G01S 7/2922; G01S 7/4004; G01S 13/5246; G11C 29/20; G11C 29/52; G11C 19/00
See application file for complete search history.

(56) References Cited

U.S. PATENT DOCUMENTS

| 4,649,394 | A | * | 3/1987 | Minker | ................. G01S 7/2927 342/93 |
| 4,958,141 | A | * | 9/1990 | Engelsman | ............... G06F 7/22 708/200 |
| 2003/0174088 | A1 | * | 9/2003 | Dizaji | ................. G01S 13/5244 342/107 |
| 2010/0073218 | A1 | * | 3/2010 | Stockmann | ......... G01S 13/5248 342/146 |

(Continued)

*Primary Examiner* — Donald H B Braswell
(74) *Attorney, Agent, or Firm* — Michael T. Gabrik; Frank D. Cimino

(57) ABSTRACT

A system includes a shift register to store data samples, where the shift register includes a cell under test (CUT), a left guard cell, a right guard cell, a left window, and a right window. The system includes two sets of comparators to compare incoming data samples with data samples in the left window and the right window to compute ranks of the incoming data samples. The system includes a sorted index array to store a rank of the data samples in the shift register. The system includes a selector to select a Kth smallest index from the sorted index array and its corresponding data sample from the shift register. The system includes a target comparator, where the first comparator input receives a data sample from the CUT and the second comparator input receives a Kth smallest data sample, and the comparator output indicates a CFAR target detection.

20 Claims, 11 Drawing Sheets

(56) References Cited

U.S. PATENT DOCUMENTS

| | | | | |
|---|---|---|---|---|
| 2015/0293208 A1* | 10/2015 | Lee | ............... | G01S 7/292 |
| | | | | 342/27 |
| 2016/0245911 A1* | 8/2016 | Wang | ............... | G01S 7/2927 |
| 2022/0299599 A1* | 9/2022 | Sahara | ............... | G01S 7/356 |

* cited by examiner

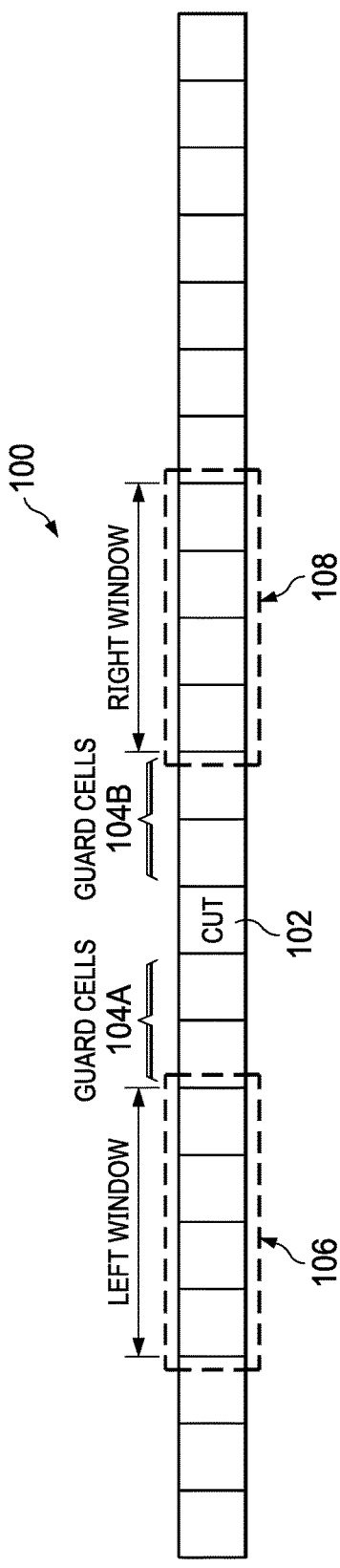
FIG. 1A
FIG. 1B
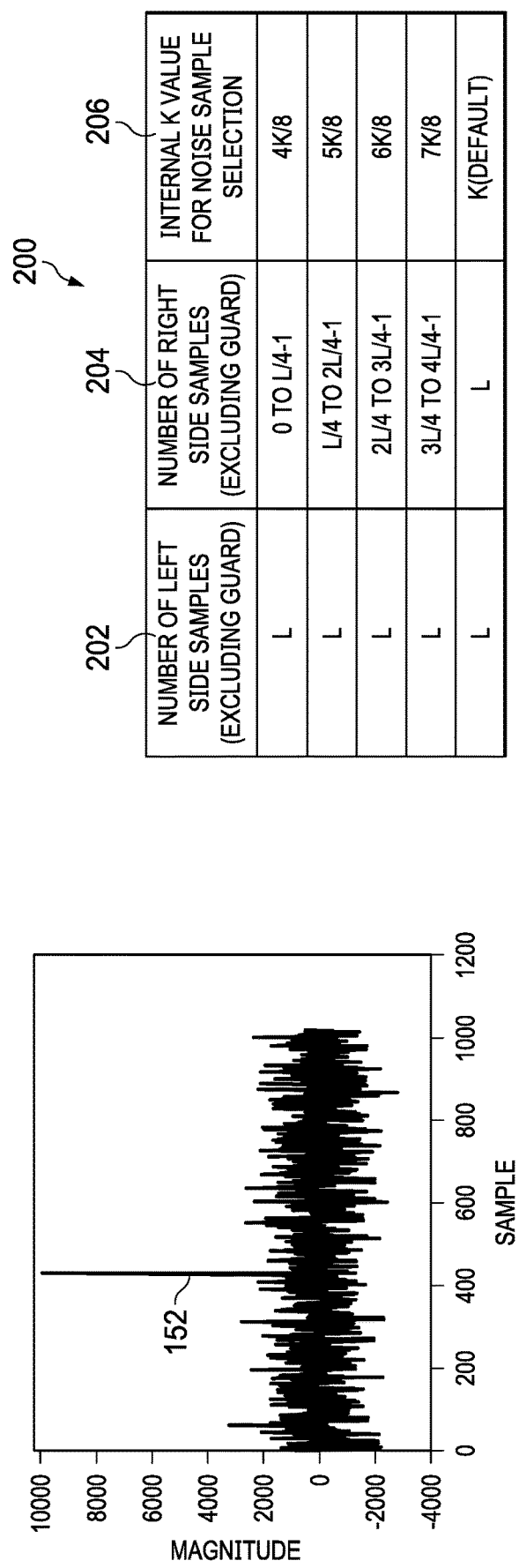
FIG. 2

CFAR OS DETECTION HARDWARE WITH TWO SETS OF COMPARATORS

CROSS-REFERENCE TO RELATED APPLICATIONS

The present application claims priority to Indian Provisional Patent Application No. 202041049954, which was filed Nov. 17, 2020, is titled "CFAR OS Detection Hardware With Special Handling Of Edge Cells & Guard Cells, And Reconfigurable As Sorter," and is hereby incorporated herein by reference in its entirety.

BACKGROUND

Radar systems perform target detection. Detection occurs when returning radar signals are received by an antenna and passed through detection circuitry. Data samples of the returning radar signals are stored in a shift register, with one data sample stored in a cell for each clock cycle. To detect a target in a data sample of a particular cell under test (CUT), a data sample is compared to a threshold. The threshold may be a function of both the probability of detection and the probability of false alarm. In a constant false alarm rate (CFAR) detection scheme, the threshold level is calculated by estimating the level of the signal in the cells around the CUT to determine a noise floor. The threshold level can be determined by calculating the average power level of a block of cells in the shift register that are around the CUT. A target is determined to be present in the CUT if the value of the data sample in the CUT is greater than the local average power level. This approach is called a cell-averaging CFAR (CA-CFAR). In the CFAR-ordered statistics (CFAR-OS) method, each CUT is compared to a threshold, where the threshold is the value of the data sample in the Kth ranked cell among a set of N neighboring cells. A target is declared present in the CUT if the data sample in the CUT is greater than the Kth ranked neighboring cell.

SUMMARY

In accordance with at least one example of the description, a method includes loading data samples into a shift register, where a first data sample is loaded into a first cell in the shift register, and where previously loaded data samples are shifted by one cell as the first data sample is loaded. The method also includes loading a second data sample into a CUT in the shift register, where a first number of cells left of the CUT are left window cells, and a second number of cells right of the CUT are right window cells. The method includes computing a noise level of the data samples. The noise level is computed by sorting data samples from the left window cells and the right window cells to create sorted data samples. The noise level is also computed by selecting a Kth smallest data sample from among the sorted data samples as the noise level, where a value of K varies in accordance with a number of valid data samples from the left window cells and the right window cells. The method also includes comparing the second data sample in the CUT to the noise level.

In accordance with at least one example of the description, a method includes shifting data samples through a shift register, where the shift register includes a CUT, a first number of left window cells left of the CUT, and a second number of right window cells right of the CUT. The method also includes computing a first rank of a first incoming data sample entering the left window cells, and computing a second rank of a second incoming data sample entering the right window cells. The method includes updating a sorted index array based on the first rank, the second rank, a third rank of a first outgoing data sample exiting the left window cells, and a fourth rank of a second outgoing data sample exiting the right window cells, where the sorted index array is updated by inserting the first rank and the second rank into positions of the sorted index array and removing the third rank and the fourth rank from positions of the sorted index array. The method also includes updating ranks of additional cells in the sorted index array based on the first rank, the second rank, the third rank, and the fourth rank.

In accordance with at least one example of the description, a system includes a shift register configured to store data samples, where the shift register includes a CUT, a left guard cell left of the CUT, a right guard cell right of the CUT, a left window left of the left guard cell, and a right window right of the right guard cell. The system includes two parallel sets of comparators configured to compare incoming data samples with data samples in the left window and the right window to compute ranks of the incoming data samples. The system also includes a sorted index array configured to store a rank of the data samples in the shift register. The system includes a selector configured to select a Kth smallest index from the sorted index array and its corresponding data sample from the shift register. The system also includes a target comparator having a comparator output and first and second comparator inputs, where the first comparator input receives a data sample from the CUT and the second comparator input receives a Kth smallest data sample, and the comparator output indicates a CFAR target detection.

BRIEF DESCRIPTION OF THE DRAWINGS

FIG. 1A is a block diagram of a shift register for edge cell handling in accordance with various examples.

FIG. 1B is a graph of radar samples in accordance with various examples.

FIG. 2 is a table for scaling K values in accordance with various examples.

DETAILED DESCRIPTION

Figure 3:
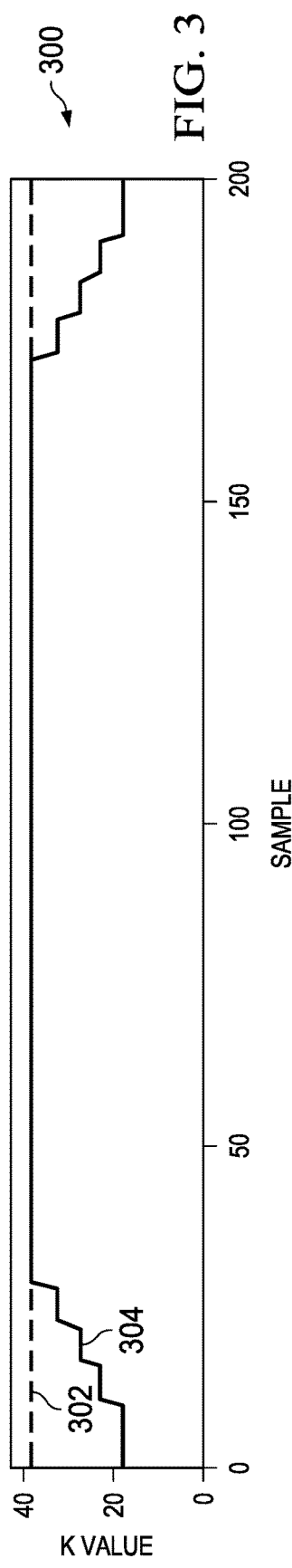
FIG. 3 is a graph of K values versus sample number in accordance with various examples.

In some alternative CFAR-OS detectors, data samples are stored in the cells of a shift register, and one cell is tested for each clock cycle to determine if that data sample corresponds to a target object detected by the radar system. For each clock cycle, N neighboring cells to the left and the right of the CUT (cell under test) are sorted in ascending order. A certain number of cells closest to the CUT are considered "guard cells" and are not included in the collection of N neighboring cells. The Kth ranked element of the N cells is selected as an estimated noise level, where K is selected to set the threshold for detection of target objects. Then, the data sample in the CUT is compared with this noise level to determine if the data sample in the CUT is higher than the noise level, and therefore contains a detected target. For large window sizes, the real time sorting of cells is computationally costly. Also, the detection system may operate at a high frequency of 400 Mhz. Support for different configurations (such as changing the value of N or the number of guard cells) is difficult. Such alternative CFAR-OS detectors may also generate invalid outputs for CUTs that are near the beginning or end of the data samples, because there may not be K data samples on either side of the CUT available for processing.

In contrast, in some examples herein, edge cells in a CFAR-OS detector are handled using a different technique than non-edge cells. Edge cells are the data samples at the beginning or ending of a string of data samples stored in the shift register (e.g., the first few data samples and the last few data samples). Instead of using a fixed Kth smallest element for data samples in the left or right edges of the shift register, a variable K value is used that is scaled down depending on the number of data samples available in the shift register. Therefore, valid outputs are generated for all data samples, even the first few and last few data samples. In another example, a serial shift register stores data samples, and implements two incoming and two outgoing data samples during each cycle. The use of two incoming and two outgoing data samples in the serial shift register enables guard cells to be used in the system and also reduces hardware costs. The number of guard cells used may also be configured by a user in some examples. In another example, CFAR-OS detection hardware can be reconfigured for use as a sorter, which sorts data samples and places them in ascending or descending order.

FIG. 1A is a block diagram of a shift register 100 for edge cell handling in accordance with various examples herein. Shift register 100 includes a CUT 102. Shift register 100 also includes guard cells 104A and 104B (collectively, guard cells 104) on either side of the CUT 102. Left window 106 and right window 108 are also shown in shift register 100. In operation, one sample enters shift register 100 every clock cycle from the left side and each sample in shift register 100 shifts one cell to the right. The samples move from left window 106, to guard cells 104A, to CUT 102, to guard cells 104B, and then to right window 108. If there is a sample in the far right cell, it exits the shift register 100. If there is a sample stored in CUT 102, the sample is compared to the computed noise level (as determined by the data samples stored in surrounding cells) to determine whether CUT 102 contains a detected target.

FIG. 1B is a graph 150 of samples in accordance with various examples herein. Graph 150 includes approximately 1000 samples. The x-axis represents the sample number, starting with zero. The y-axis represents the magnitude of the sample. Some of the samples are negative and some are positive. For negative samples, the absolute value of the sample is stored in shift register 100 and used for CFAR target detection.

In FIG. 1B, an example sample 152 has a higher magnitude than the other samples. A goal of CFAR detection is to detect sample 152 as a target, while rejecting other samples as targets. Shift register 100 in FIG. 1A and the examples herein provide techniques for detecting sample 152.

Referring again to FIG. 1A, a sample enters shift register 100 at every clock cycle. Samples in shift register 100 shift one cell to the right each clock cycle. After a sample is placed into CUT 102, the sample in CUT 102 is analyzed for target detection. Samples are tested for target detection during each clock cycle until all samples are exhausted. To test CUT 102, guard cells 104 are ignored in the computation of the noise level. In some examples, a sample with a strong peak may leak into neighboring samples. Therefore, to prevent false positives, one or more guard cells 104 on each side of CUT 102 are ignored when testing a CUT 102 against other samples for target detection. Two guard cells (104A and 104B) are shown on each side of CUT 102 in FIG. 1A, but any number of guard cells 104 may be used in other examples.

For each clock cycle, a number N of left and right cells neighboring CUT 102 are selected and sorted. The neighboring cells N that are selected are the cells in left window 106 and right window 108. Four cells are shown in left window 106 and right window 108 in shift register 100, but left window 106 and right window 108 may include any number of cells in other examples. The samples in the cells in left window 106 and right window 108 are sorted in magnitude order. Then, the smallest Kth cell of the N cells is used as the estimated noise level. The sample data value stored in CUT 102 is compared with the estimated noise level. In some examples, a multiplicative or additive margin may also be useful. If the sample value in CUT 102 is higher than the estimated noise level, the target is detected in the sample value. If the sample value is lower than the estimated noise level, no target is detected in the sample value. At the next clock cycle, the samples shift one cell to the right in shift register 100, and the new CUT 102 is tested for target detection against a new estimated noise level based on the samples now stored in left window 106 and right window 108.

In one example, a collection of 200 radar samples is analyzed with a K value of 36, and the left window 106 and right window 108 each include 24 cells. Therefore, N=48 in this example. If there are four guard cells 104 on each side of CUT 102, for the first 28 samples (samples 0 to 27) and the last 28 samples (samples 171 to 199), there are insufficient samples stored in left window 106 and right window 108 to select the 36$^{th}$ ranked sample of 48 samples. That is, either left window 106 or right window 108 does not have a valid sample stored in each cell. Therefore, in examples herein, a variable K is used that is a scaled down version of the original K value, and the variable K depends on the number of window samples available during a given clock cycle.

In an example, the samples enter shift register 100 from the left and are shifted to the right during each clock cycle, one at a time. First, left window 106 fills up after the requisite number of clock cycles has completed. Then, samples enter guard cells 104A. Finally, the first sample (sample 0) reaches CUT 102. When the first sample reaches CUT 102, there are 24 samples in left window 106 but no samples in right window 108. If an N of 48 and a K of 36 were used, there would not be enough samples to test CUT 102. Instead, in this example, 24 samples from left window 106 are used along with zero samples from right window 108. Because there are only 24 samples, a value of K smaller than 36 is useful. For example, K could be 18 in this example. If the value of the sample in CUT 102 is greater than the 18$^{th}$ ranked sample of the 24 samples, the target is detected in the sample in CUT 102.

As more samples are loaded into shift register 100, guard cells 104B and right window 108 begin to fill. As those cells fill with samples, the value of K can be increased in steps until both left window 106 and right window 108 are full. If both left window 106 and right window 108 are full, a K of 36 is used.

Shift register 100 continues shifting samples, and the samples are processed for target detection as described above. As the end of the 200 samples nears, left window 106 begins to empty, and therefore left window 106 will have fewer than 24 samples for the later samples in CUT 102. In those cases, the value of K can be reduced symmetrically for left window 106 as it was reduced for right window 108 as described above. With this technique, a valid output is generated for each of the 200 radar samples.

FIG. 2 is a table 200 for scaling K values (e.g., reducing K in certain circumstances as described above) in accordance with various examples herein. Table 200 shows one technique for scaling K, and other scaling may be used in other examples. In this example, 200 radar samples enter shift register 100 from the left and are shifted one cell to the right at each clock cycle. When the first radar sample reaches CUT 102, left window 106 is full. The number of samples in left window 106 is denoted as "L" (excluding guard cells 104) and is shown in the first column 202. Column 204 shows the number of right side samples in right window 108. Column 206 shows the K value for noise sample selection.

In column 204 of table 200, the second row denotes an example where the number of right side samples is 0 to L/4−1. For example, if the number of neighboring cells used for samples (N) is 48, then 24 of those samples are in left window 106 and 24 are in right window 108. Therefore, L is 24. The full value of K is 36 in this example. When the first samples enter shift register 100, left window 106 fills up first, then guard cell 104A, then CUT 102, then guard cells 104B, and then right window 108. If the number of samples in right window 108 is between 0 and L/4−1 (between 0 and 5), then the second row in table 200 indicates the value of K. For this scenario, the K value is 4K/8, or 18. Therefore, for a CUT 102 that is analyzed when there are between 0 and 5 samples in right window 108, the scaled value of K is 18. For these instances, there will be 24 samples in left window 106, and 0 to 5 samples in right window 108, for a total sample number between 24 and 29. The 24 to 29 samples are ranked, and the 18$^{th}$ sample is selected as the representative noise level that is compared to the sample in CUT 102. If the sample in CUT 102 is greater than the 18$^{th}$ sample, the target is detected. If the sample in CUT 102 is lower than the 18$^{th}$ sample, the target is not detected. With this technique, the first samples in the 200 samples can be tested when they reach CUT 102 even if there are fewer than K total samples in the left window 106 and the right window 108.

As another example, when the number of samples in right window 108 is between L/4 and 2L/4−1 (e.g., between 6 and 11), the scaled value of K used is 5K/8, or 22.5. This value is indicated in the third row of table 200. Because this is a fractional number, the value of K can be rounded to either 22 or 23. In the next example in table 200, when the number of samples in right window 108 is between 2L/4 and 3L/4−1 (e.g., 12 to 17), the scaled value of K used is 6K/8, or 27. In the next example in table 200, when the number of samples in right window 108 is between 3L/4 and 4L/4−1 (e.g., 18 to 23), the scaled value of K used is 7K/8, or 31.5, which can be rounded to 31 or 32. Finally, after right window 108 fills up with L=24 samples, the default value of K can be used (K=36). In other examples, different scaled K values can be used for the number of samples in right window 108. The scaled K values in column 206 are merely illustrative. Also, the K value may be scaled down as left window 106 empties because the end of the incoming samples is reached. In this example, as the number of samples in left window 106 falls below L, the value of K may be scaled in a similar manner to the scaling performed for right window 108. Therefore, the last samples in the 200 samples may also be tested when they reach CUT 102, even if the number of total samples in the left window 106 falls below L.

FIG. 3 is a graph 300 of K values versus sample number in accordance with various examples. The x-axis indicates the sample number, while the y-axis indicates the K value. In graph 300, 200 radar samples are collected and analyzed as described above. In addition, the default K value is 36. As shown on graph 300, curve 302 is a flat line that indicates the default value of K for every sample number. Curve 304 indicates the K value when scaling of K for edge samples is implemented as described above with respect to the discussion of FIGS. 1A and 2. Curve 304 indicates that for the early samples (samples between 1 and 28), the value of K begins at 18, and steps up incrementally until it reaches 36. For the last samples (between around 172 and 200), K steps down incrementally from 36 until it reaches 18. Graph 300 demonstrates that for each of the 200 samples, a K value is selected so that a valid output is generated for each sample.

Figure 4A:
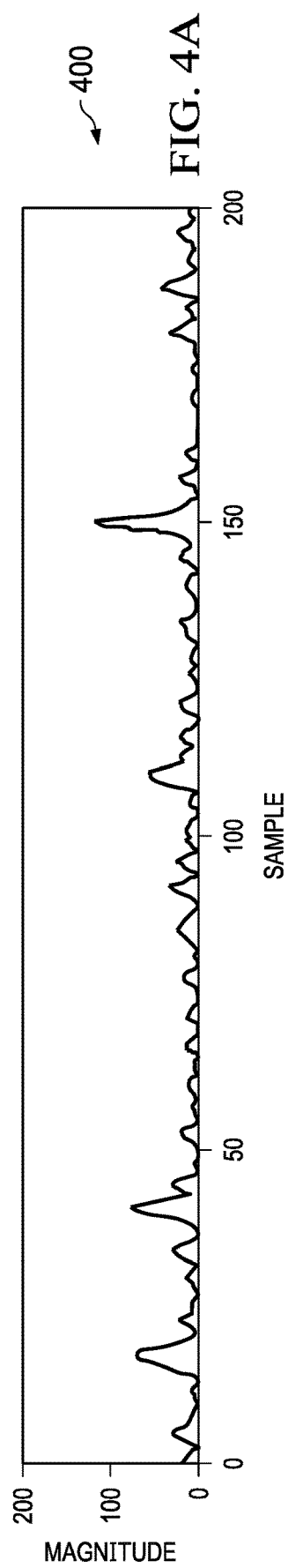
FIG. 4A is a graph of the magnitude of data samples in accordance with various examples.

FIG. 4A is a graph 400 of the magnitude of 200 data samples in accordance with various examples. The x-axis indicates the sample number, while the y-axis indicates the magnitude of the sample. The magnitude value indicates the value that is stored in the cells of shift register 100, and those magnitude values are used to find the Kth value for target detection. The 200 samples in graph 400 provide an example data set for FIG. 4B as described below.

Figure 4B:
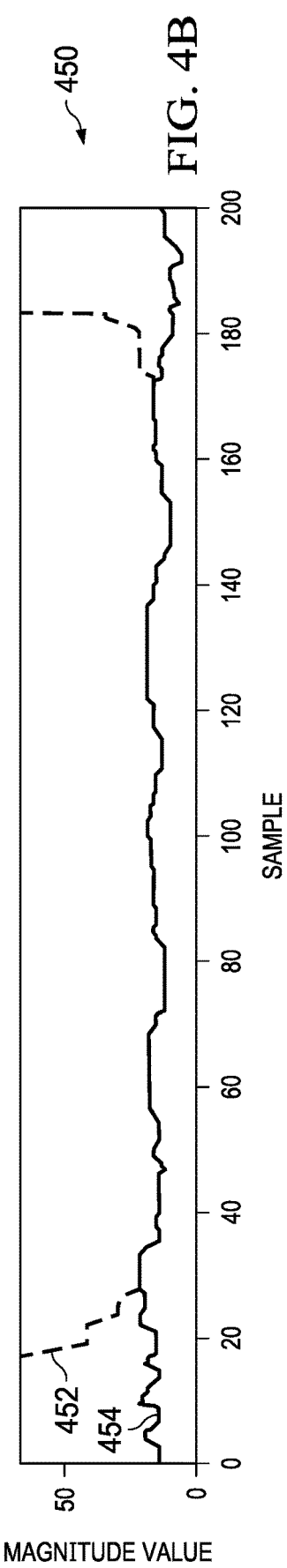
FIG. 4B is a graph of noise level versus sample number in accordance with various examples.

FIG. 4B is a graph 450 of noise level versus sample number in accordance with various examples herein. The x-axis indicates the sample number, while the y-axis indicates the magnitude value of the noise level (e.g., the magnitude value of K). The magnitude of the noise level is the value of the Kth smallest element that is compared to the CUT 102 for target detection. In this example, the default value of K is 36, and the size of left window 106 and right window 108 are each 24 cells. The data set for the samples in FIG. 4B are the magnitude values of the data samples shown in FIG. 4A.

Two curves are shown in graph 450. Curve 452 indicates the K values for an alternative system that does not scale the K value for the edge samples as described herein. Curve 454 indicates the K values that are scaled for edge samples in accordance with various examples herein. Curve 452 shows that for the alternative system, for the first approximately 18 samples and the last approximately 18 samples, no K value is computed. In the alternative system, there are not enough samples in both left window 106 and right window 108 to compute a K value for the first and last edge samples. Also, the K values for samples between approximately 19 to 28 and between approximately 172 to 181 are much higher than the K values for the other samples, as shown by the magnitude value of curve 452 for those samples. In the alternative system, those computed K values are distorted due to using a static value of K rather than a variable K.

Curve 454 shows that for each of the 200 samples, a K value is computed in accordance with examples herein. The K values are computed by scaling the value of K for the edge samples as described above with respect to table 200 in FIG. 2. Also, the K values for the approximately first 28 samples (where L is 24 plus the number of guard cells is 4) and approximately last 28 samples are within the range of K values for samples between 28 and 172, which is an indication that the techniques described herein produce valid K values for all samples.

For samples between approximately 28 and 172, curve 452 and curve 454 provide similar K values and the curves mostly coincide with one another. For these samples, both techniques have a full or mostly full left window 106 and right window 108, and therefore each technique will produce a similar K value.

Figure 5:
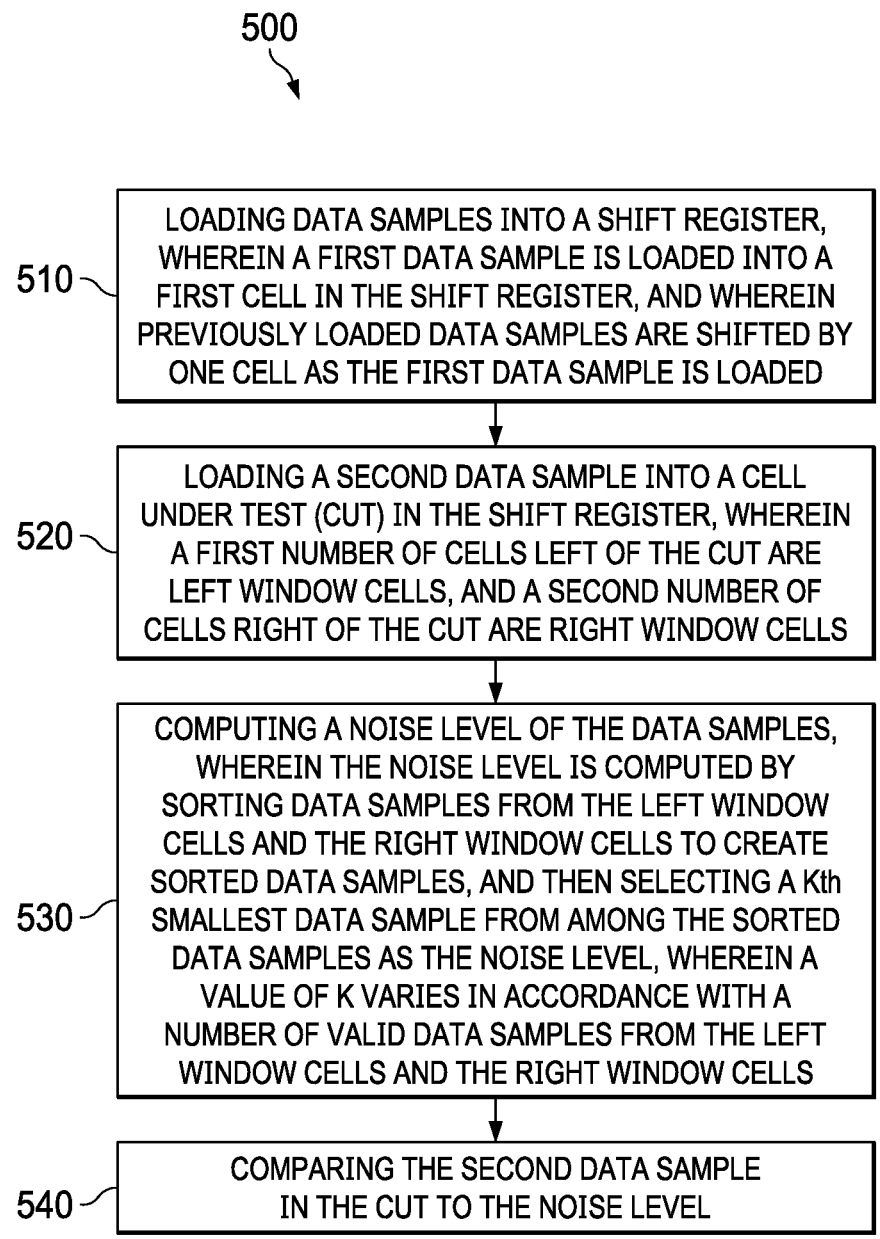
FIG. 5 is a flow diagram of a method for target detection among data samples in accordance with various examples.

FIG. 5 is a flow diagram of a method 500 for target detection among data samples in accordance with various examples herein. The steps of method 500 may be performed in any suitable order. The hardware components described above with respect to FIG. 1A can perform method 500 in one example.

Method 500 begins at 510, where data samples are loaded into a shift register, and where a first data sample is loaded into a first cell in the shift register. Previously loaded data samples are shifted by one cell as the first data sample is loaded. As described above, data samples are loaded into shift register 100 and then shifted one cell each clock cycle.

Method 500 continues at 520, where a second data sample is loaded into a CUT in the shift register, where a first number of cells left of the CUT are left window cells, and a second number of cells right of the CUT are right window cells. The size of the left and right window cells may be any suitable size.

Method 500 continues at 530, where a noise level of the data sample is computed. The noise level is computed by sorting data samples from the left window cells and the right window cells to create sorted data samples. Then, a Kth smallest data sample is selected from among the sorted data samples as the noise level, where a value of K varies in accordance with a number of valid data samples from the left window cells and the right window cells. For the initial few data samples when the shift register is being loaded, data samples from L cells in the left window cells may be sorted while data samples from fewer than L cells in the right window cells may be sorted. The noise level is used as the target for detection. K may be selected based on the number of data samples from the right window cells (e.g., right window 108). K may be scaled as described above when right window 108 does not have valid data samples in each cell of right window 108.

Method 500 continues at 540, where the second data sample in the CUT is tested by comparing the second data sample in the CUT to the noise level. If the data sample in the CUT is above the noise level, the target is detected. If the data sample in the CUT is below the noise level, no target is detected. With method 500, each data sample can be tested against the noise level even if left window 106 or right window 108 does not have data samples stored in each cell.

Figure 6A:
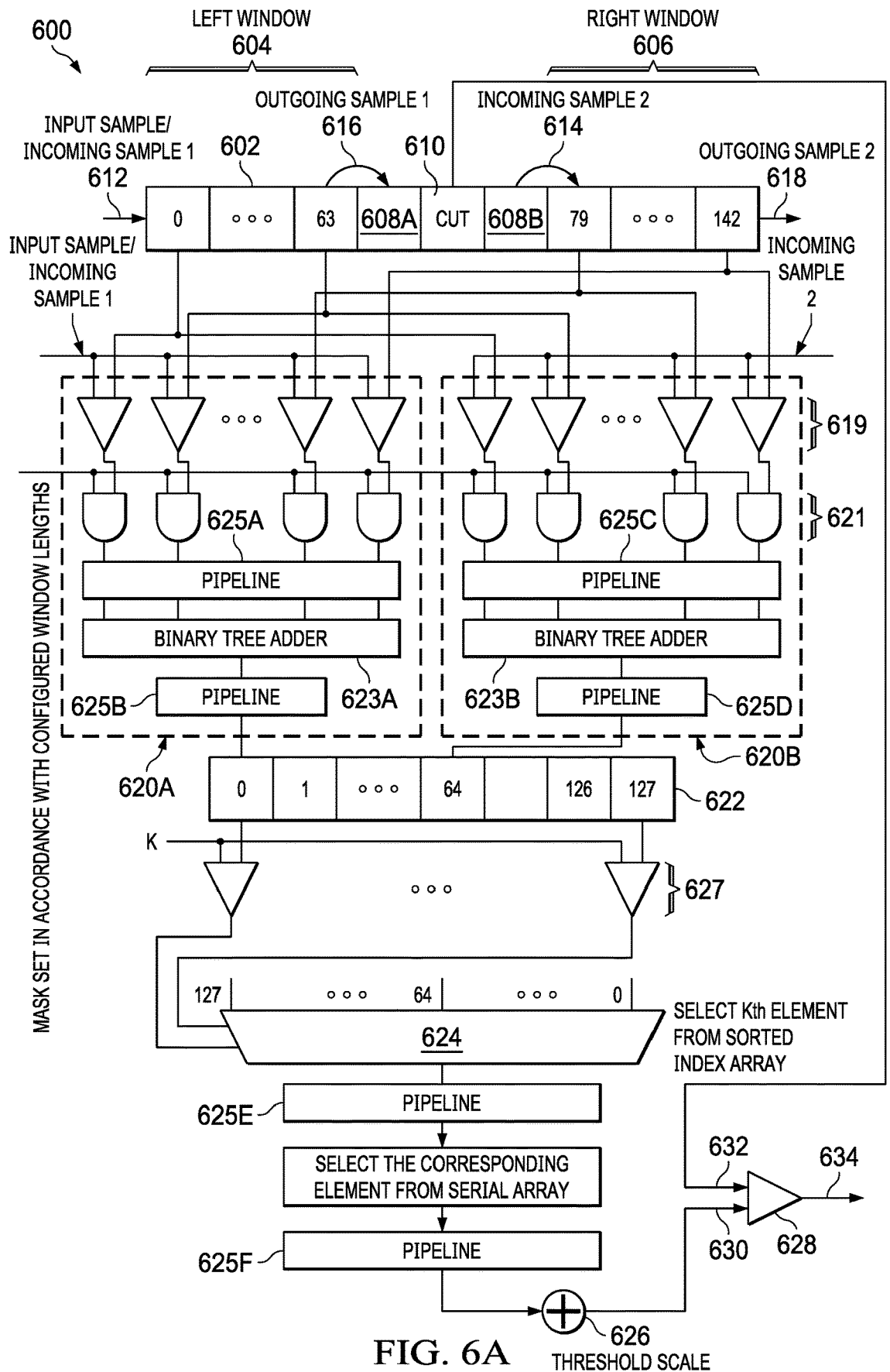
FIG. 6A is a system for handling guard cells in accordance with various examples.

FIG. 6A is a system 600 for handling guard cells in accordance with various examples herein. System 600 includes a shift register 602. Shift register 602 includes left window 604, right window 606, guard cells 608A and 608B, and CUT 610. Two incoming samples (incoming sample 1 612 and incoming sample 2 614) and two outgoing samples (outgoing sample 1 616 and outgoing sample 2 618) are also shown in FIG. 6A. System 600 includes two parallel rank determining circuits 620A and 620B and a sorted index array 622. Rank determining circuits 620A and 620B include comparators 619, AND gates 621, binary tree adders 632A and 623B, and pipelines 625A, 625B, 625C, and 625D. System 600 also includes selector 624, pipelines 625E and 625F, threshold scale 626, comparators 627, and target comparator 628.

System 600 provides techniques for handling samples that enter and exit shift register 602, as well as samples that enter and exit guard cells 608A and 608B. Shift register 602 includes left window 604 that contains the samples to the left of CUT 610 that are used for target detection, while right window 606 contains the samples to the right of CUT 610 that are used for target detection. Left window 604 and right window 606 may be any suitable size, and in this example, each window is 64 cells wide. Shift register 602 also includes guard cells 608A and 608B, which can be any suitable size. In this example, guard cells 608A and 608B are each four cells wide.

To perform target detection for a CUT 610, the sample values stored in left window 604 and right window 606 are sorted in magnitude order, and the Kth value is selected to compare to CUT 610 using target comparator 628. The Kth value may be selected using a variable K value for edge cells as described above in the description of FIGS. 1A to 5. At each clock cycle, a new input sample enters cell 0 of shift register 602. Also, at each clock cycle, a sample exits shift register 602 from cell 142. At each clock cycle, a sample exits left window 604 and enters guard cells 608A. At each clock cycle, a sample also exits guard cells 608B and enters right window 606. Therefore, during each clock cycle, two samples enter the collection of samples used for target detection, while two samples exit the collection of samples used for target detection. System 600 handles these four samples as described in an example herein.

Figure 6B:
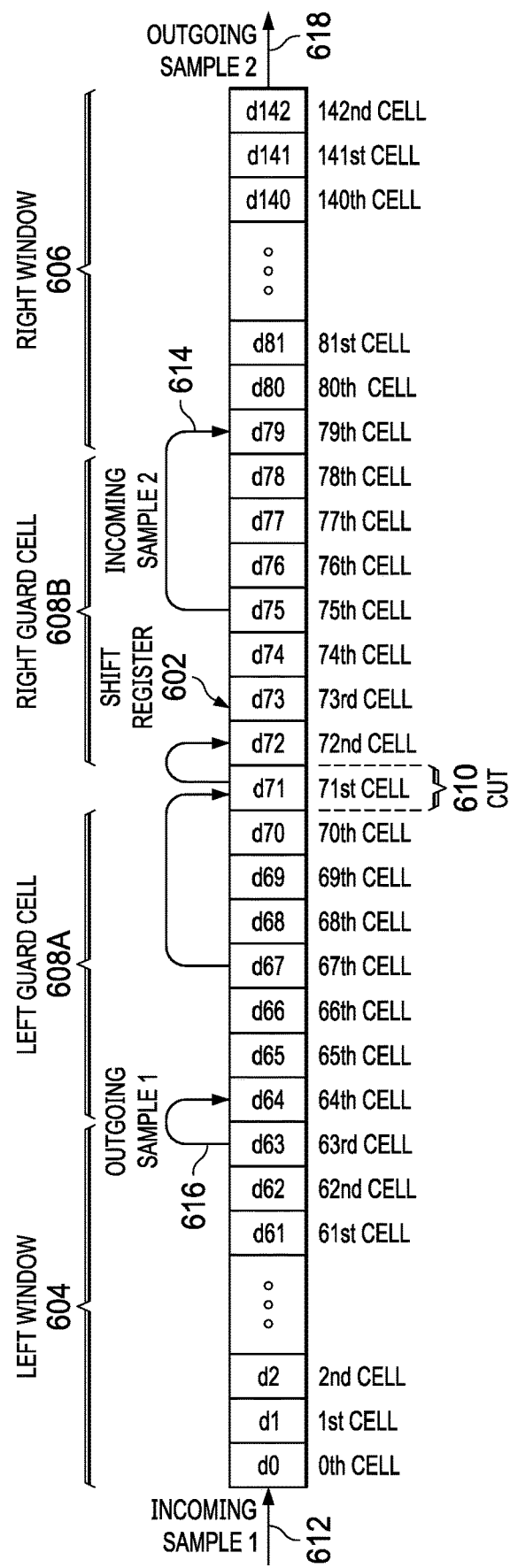
FIG. 6B is a shift register in accordance with various examples.

FIG. 6B is a shift register 602 with a window size of 64 cells and a guard cell size of 4 cells in accordance with various examples herein. Seven guard cells are available in left guard cell 608A, and seven guard cells are available in right guard cell 608B. A user may select the number of guard cells to use for each side, from 0 to 7 guard cells. In this example, four guard cells are used for each of the left and right guard cells 608. Therefore, three of the seven cells in left guard cell 608A are unused (e.g., cells 68, 69, and 70), and three of the guard cells in right guard cell 608B are unused (e.g., cells 76, 77, and 78) in this example. To begin, the values in the cells in shift register 602 may be initialized to the maximum value for each cell in one example. Then, at a first clock cycle, incoming sample 1 612 enters shift register 602 at cell 0. Each sample in shift register 602 shifts one cell to the right at the first clock cycle. The samples in left window 604 shift one cell to the right, and the sample in cell 63 exits left window 604 and enters guard cell 608A. The sample that enters guard cell 608A is referred to as outgoing sample 1 616. Here d0, d1, d2 . . . d141, d142, etc., indicate the data samples in the shift register in any cycle.

At the first clock cycle, the sample in cell 75 (the rightmost cell of guard cell 608B, because only four guard cells are used in this example) exits guard cell 608B and enters right window 606 at cell 79. Cells 76, 77, and 78 are jumped because those are unused guard cells in this example. The sample that enters right window 606 at cell 79 is referred to as incoming sample 2 614. Finally, at the first clock cycle, a sample leaves cell 142 of right window 606 and exits shift register 602. The sample that leaves right window 606 is referred to as outgoing sample 2 618. Independent of the size of the window or guard, position of CUT 610 is fixed to cell 71 in the shift register 602.

Therefore, at each clock cycle, two samples enter the collection of cells that are used for target detection (incoming sample 1 612 and incoming sample 2 614), and two samples leave the collection of cells that are used for target detection (outgoing sample 1 616 and outgoing sample 2 618). Target detection is performed by sorting the samples in left window 604 and right window 606 in magnitude order, selecting the Kth ranked sample, and comparing the Kth ranked sample to the sample in CUT 610. At each clock cycle, the sorted samples are updated by adding the two incoming samples (incoming sample 1 612 and incoming sample 2 614) and removing the two outgoing samples (outgoing sample 1 616 and outgoing sample 2 618), and then calculating the new value of K. System 600 is configured to provide this update at each clock cycle.

At each clock cycle, parallel rank determining circuits 620A and 620B (in FIG. 6A) receive data samples from the cells in left window 604 and right window 606. Rank determining circuit 620A performs the comparison of incoming sample 1 612 with data samples in left window 604 and right window 606. Rank determining circuit 620B performs the comparison for incoming sample 2 614 with data samples in left window 604 and right window 606. Rank determining circuits 620A and 620B include two parallel sets of comparators 619. Rank determining circuit 620A consists of 128 comparators 619 (64 comparators 619 for left window 604 and 64 comparators 619 for right window 606). Rank determining circuit 620B consists of 128 comparators 619. Each comparator 619 has two inputs, where one input receives the incoming sample and another input receives a data sample from the left window 604 or right window 606. The output of the comparator 619 is set to a value of 1, if the incoming sample is greater than the window sample. Results of all the 128 comparators 619 in rank determining circuit 620A are added to compute the rank of incoming sample 1 612. Results of all the 128 comparators 619 in rank determining circuit 620B are added to compute the rank of incoming sample 2 614. According to window length, mask values are set and ANDed with window comparison results using AND gates 621. For example, a mask value of a valid window cell is marked as 1, while an invalid window cell is marked as 0. Only those valid window comparison results are added with binary tree adders 623A and 623B to compute the ranks of the incoming samples 1 and 2. In other examples, a different type of adder may be useful. For the comparison, CUT 610, guard cell 608 A, and guard cell 608 B are excluded. Pipelines 625A and 625C store the output of AND gates 621 and provide this output to binary tree adders 623A and 623B. Binary tree adders 623A and 623B perform addition and then provide output data to pipelines 625B and 625D, respectively. The components shown and described in system 600 provide one example for a rank determining circuit. However, in other examples, any appropriate circuitry, logic, hardware, or software to implement rank determining circuit 620A and 620B may be used.

Sorted index array 622 has 128 cells and the cells of sorted index array are initialized with values from 1 to 128. Depending on the size of the window, all of the cells of the sorted index array or only a few cells may be valid. Sorted index array 622 does not store the sample values that are stored in shift register 602 in this example. Here, sorted index array 622 stores the ranks of the samples of left window 604 and right window 606. Sorted index array 622 indicates the ascending order rank of the samples (the smallest sample is ranked as 1).

Figure 6C:
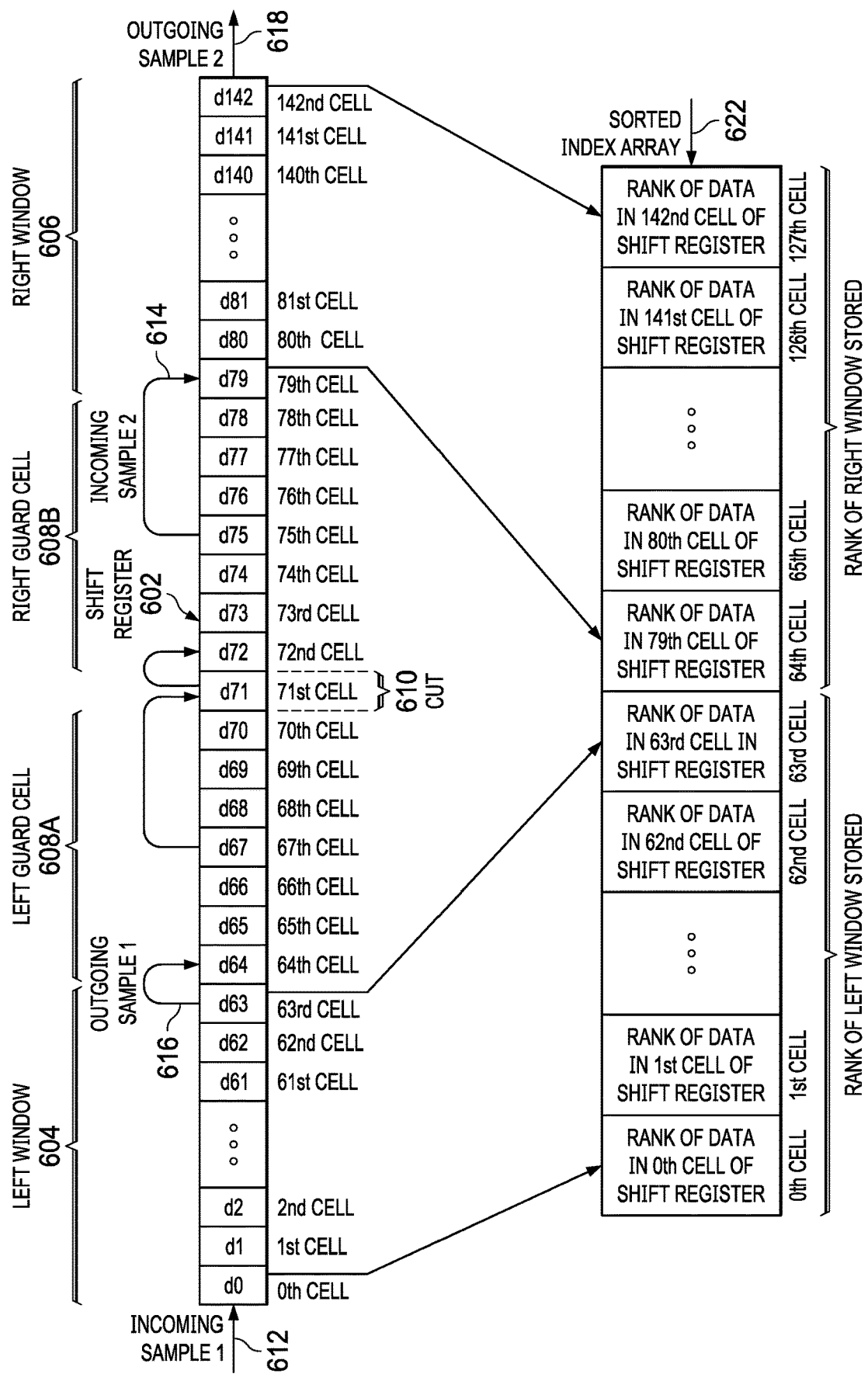
FIG. 6C is a mapping of a shift register and a sorted index array in accordance with various examples.

FIG. 6C shows the shift register cells and position of their ranks stored in sorted index array 622 with the size of the window as 64 and the size of the guard cells as 4. In this example, ranks of the left window samples 0 to 63 in shift register 602 are stored in cells 0 to 63 in sorted index array 622. Ranks of the right window samples from 79 to 142 in shift register 602 are stored in cells 64 to 127 in sorted index array 622. If the smallest sample value in shift register 602 is stored in cell 5 of shift register 602, the rank value 0 is stored in cell 5 of sorted index array 622. If the second smallest sample value in shift register 602 is stored in cell 84 of shift register 602, the rank value of 2 is stored in cell 69 of sorted index array 622. The rank of the $84^{th}$ cell in shift register 602 is stored in the $69^{th}$ cell in sorted index array 622 because there are no rank values stored for CUT 610 and guard cells 608 (which collectively include 15 cells), and therefore 84−15 is 69.

At each clock cycle, the elements of sorted index array 622 are updated. The ranks of incoming sample 1 612 and incoming sample 2 614 are inserted into the appropriate cells in sorted index array 622 depending on size of the window. Also, the ranks of outgoing sample 1 616 and outgoing sample 2 618 are removed from their respective cells in sorted index array 622. For a window size of 64, the rank values of incoming sample 1 and incoming sample 2 are inserted to the $0^{th}$ cell and the $64^{th}$ cell of sorted index array 622, while the rank values of outgoing sample 1 and outgoing sample 2 are removed from the $63^{rd}$ cell and the $127^{th}$ cell of sorted index array 622. All other cells except 0, 63, 64, and 127 of the sorted index array are updated incrementally.

Figure 6D:
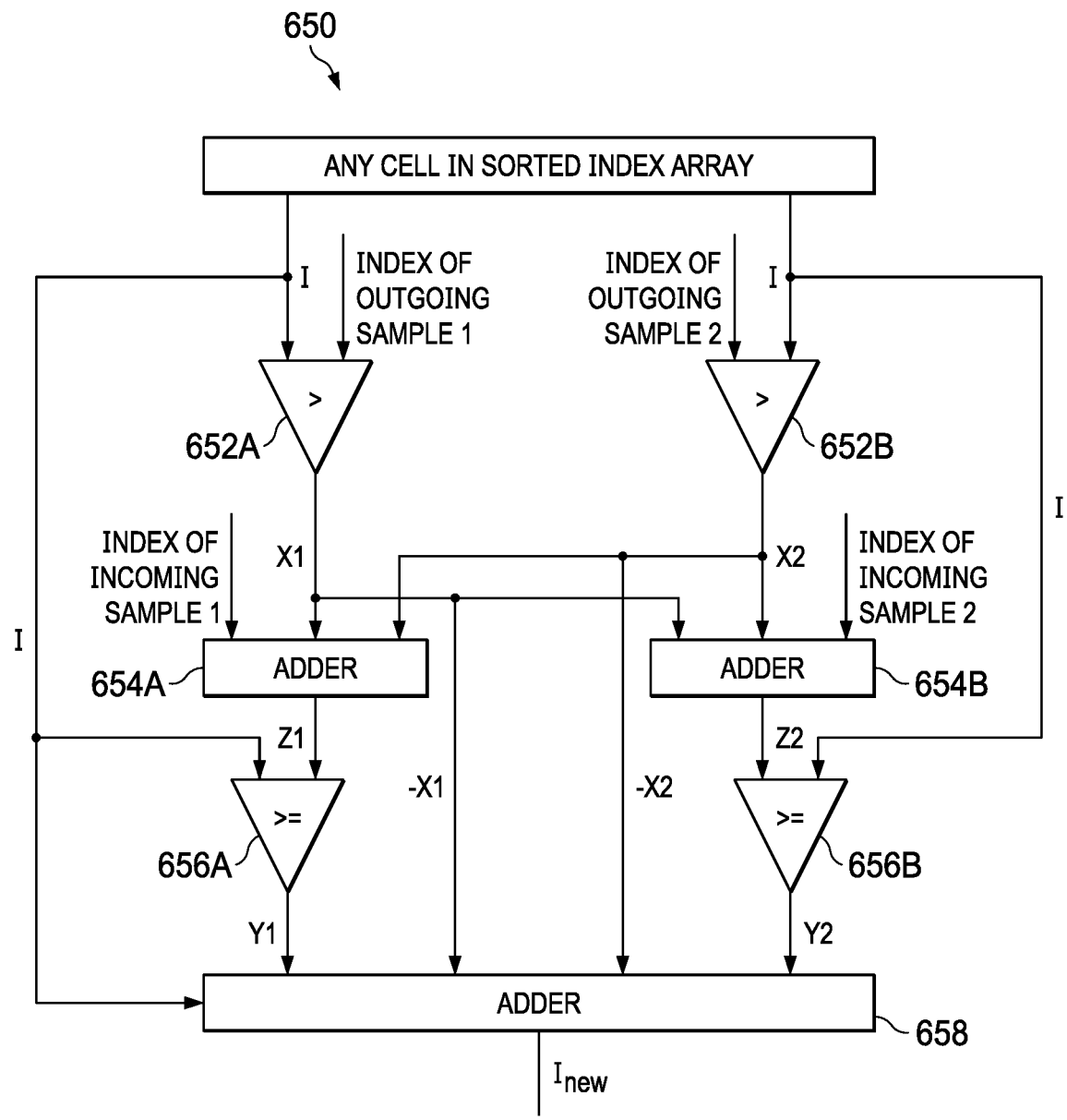
FIG. 6D is a circuit for incremental update of a cell in a sorted index array in accordance with various examples.

FIG. 6D is an example circuit 650 for incrementally updating a cell in a sorted index array. The process for incrementally updating the cell is also illustrated with the equations below. The circuit 650 includes comparators 652A and 652B, adders 654A and 654B, comparators 656A and 656B, and adder 658.

For example, if the rank of any cell in sorted index array is I, the rank of the cell is compared with the rank of outgoing samples 1 and 2 as shown below in Equations (1) and (2):

$$X1=1, \text{ if } I>\text{rank of outgoing sample 1 616, Else 0} \quad (1)$$

$$X2=1, \text{ if } I>\text{rank of outgoing sample 2 618, Else 0} \quad (2)$$

The results of the above comparisons (X1 and X2) are added to the rank of the incoming samples as shown in Equations (3) and (4) to determine modified ranks Z1 and Z2:

$$Z1=\text{rank of incoming sample 1 612}+X1+X2 \quad (3)$$

$$Z2=\text{rank of incoming sample 2 614}+X1+X2 \quad (4)$$

Finally, the rank of the cell is compared with the modified rank (Z1, Z2) of incoming samples in Equations (5) and (6):

$$Y1=1, \text{ if } I \geq Z1 \text{ Else 0} \quad (5)$$

$$Y2=1, \text{ if } I \geq Z2 \text{ Else 0} \quad (6)$$

The incrementally updated rank $I_{new}$ of the new cell is shown in Equation (7):

$$I\text{new}=I+Y1+Y2-X1-X2 \quad (7)$$

The ranks of the cells are incrementally updated and shifted one cell right corresponding to the data sample in shift register 602. Instead of performing a new sorting of all data samples every cycle (which is costly due to increased power consumption, more logic area, and lower speed), sorted index array 622 is incrementally updated with respect to the addition of two new samples and the removal of two samples.

After sorted index array 622 is updated each clock cycle, selector 624 selects the Kth sorted element from sorted index array 622 and its corresponding sample value from shift register 602 is collected. System 600 includes 128 comparators 627, which compare the values in sorted index array 622 to K to determine the Kth sorted element, and provide the results of the comparisons to selector 624 for selection. For example, if K is 80 and the cell containing the rank 80 is the $10^{th}$ cell of sorted index array 622, then the sample value from the $10^{th}$ cell of the shift register 602 is collected. As another example, if K is 10, the cell containing the rank 10 is the $64^{th}$ cell of the sorted index array 622. Then, the sample value from the $79^{th}$ cell (79=64+15, because CUT 610 and guard cells 608 do not have a rank value) of shift register 602 is collected. This sample value may then be scaled using threshold scale 626 (shown in FIG. 6A) in some examples. The output of threshold scale 626 is provided to a first input 630 of target comparator 628. The sample value in CUT 610 is provided to the second input 632 of target comparator 628. The output 634 of target comparator 628 indicates whether a target is detected with the sample from CUT 610. After the detection process completes, a second cycle begins and the process described above repeats for the new input samples (incoming sample 1 612 and incoming sample 2 614). The process continues until all input samples have been tested for target detection.

System 600 provides for the number of window cells (604 or 606) or guard cells 608 in shift register 602 to be adjusted in various examples. If guard cells 608 or window cells (604 or 606) are added or removed, system 600 continues to operate as described, because incoming sample 1 612, incoming sample 2 614, outgoing sample 1 616, and outgoing sample 2 618 are handled by the hardware in system 600 without dependence on the size of the guard cells 608 or window cells 604 or 606. Therefore, system 600 provides for flexibility in deploying system 600 in different applications that use a different number of data samples for CFAR detection.

System 600 may also be reconfigured as a pure sorter in some examples. Reconfiguring the CFAR-OS detection hardware of system 600 as a pure sorter reduces hardware area in a radar system, because the hardware of system 600 is repurposed for an additional function. To use system 600 as a sorter, input samples are accepted sequentially, with one input sample per clock cycle. The size of the guard cells 608A and 608B can be reduced to zero and the window length can be set as equal to the size of the entire shift register 602. As input samples arrive sequentially every cycle, their corresponding rank is updated in sorted index array 622. After all input samples have arrived, and the ranks corresponding to all the samples are updated in sorted index array 622, the rank values can be sequentially output from sorted index array 622.

In one example, a value of infinity is inserted as the middle element of input samples. The input samples are shifted every cycle, and when the middle element reaches CUT 610 in shift register 602, the sorted index array 622 is updated with the rank values of all the samples in the left and right window of the shift register 602. A sorted index position such as this is useful in many automotive applications. For example, an application may request selection of the top 100 detected targets out of 150 detected targets. The 150 magnitudes are sorted using the sorter, and the indices of the top 100 elements are determined. Then, a processor can fetch the data from the correct locations in memory.

Figure 7:
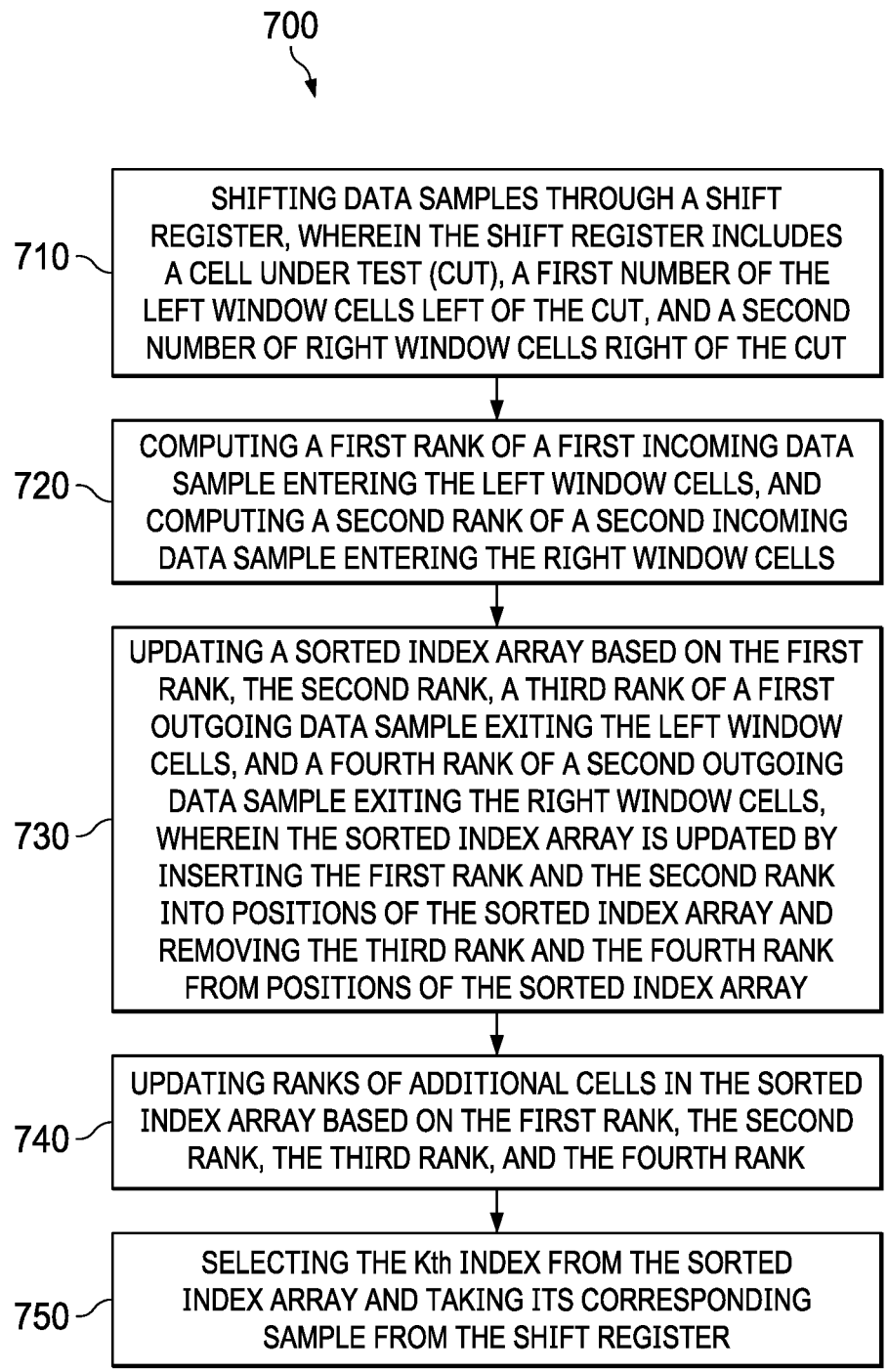
FIG. 7 is a flow diagram of a method for target detection among data samples in accordance with various examples.

FIG. 7 is a flow diagram of a method 700 for target detection among data samples in accordance with various examples herein. The steps of method 700 may be performed in any suitable order. The hardware components described above with respect to FIG. 6A can perform method 700 in one example.

Method 700 begins at 710, where data samples are shifted through a shift register, where the shift register includes a CUT, a first number of left window cells left of the CUT, and a second number of right window cells right of the CUT. One example of a shift register for CFAR detection is shift register 602 in system 600.

Method 700 continues at 720, where a first rank of a first incoming data sample entering the left window cells is computed, and a second rank of a second incoming data sample entering the right window cells is computed. As described above, incoming sample 1 612 and incoming sample 2 614 are added during each clock cycle.

Method 700 continues at 730, where a sorted index array is updated based on the first rank, the second rank, a third rank of a first outgoing data sample exiting the left window cells, and a fourth rank of a second outgoing data sample exiting the right window cells. As described above, outgoing sample 1 616 and outgoing sample 2 618 are removed during each clock cycle. The sorted index array is updated by inserting the first rank and the second rank into positions of the sorted index array, and removing the third rank and the fourth rank from positions of the sorted index array.

Method 700 continues at 740, where ranks of additional cells in the sorted index array are updated based on the first rank, the second rank, the third rank, and the fourth rank.

Method 700 continues at 750, where the Kth index is selected from the sorted index array (such as sorted index array 622) and its corresponding sample is taken from the shift register (such as shift register 602). A data sample from the CUT is tested for CFAR detection by comparing the data sample from the CUT to a Kth smallest data sample at first input 630. As described above, a comparator such as target comparator 628 may test the data sample from the CUT for CFAR detection.

Figure 8A:
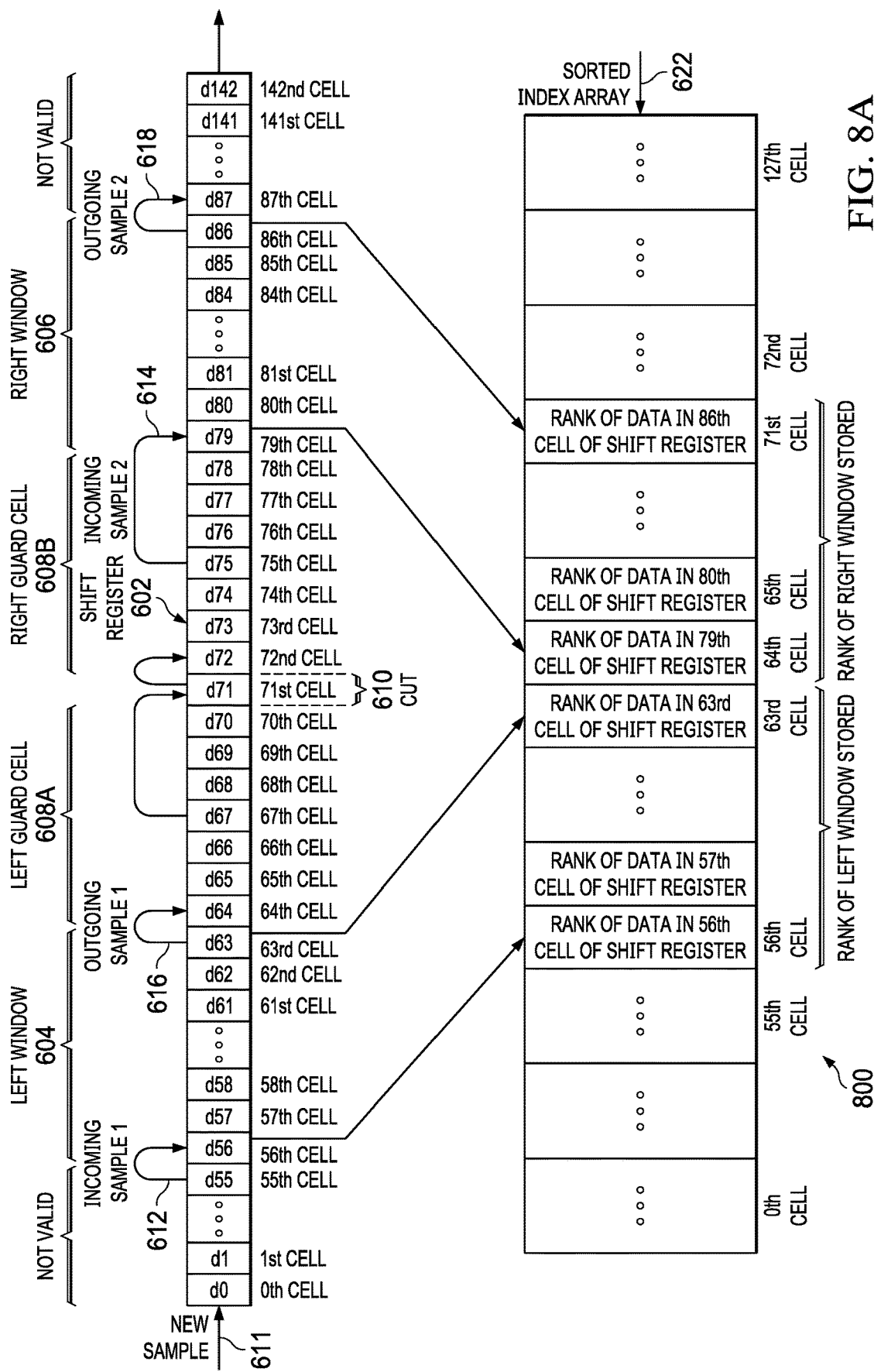
FIG. 8A is a mapping of a shift register to a sorted index array in accordance with various examples.

FIG. 8A is an example system 800 for mapping of a shift register 602 to a sorted index array 622. As shown in FIG. 8A, shift register 602 may be configured with a window size of 8 and the number of guard cells as 4. Cells of shift register 602 are initialized with a maximum value at the beginning of the process. Here, in this example, the cells 56 to 63 are left window cells 604, the cells 64 to 67 are left guard cells 608A, the cells 72 to 75 are right guard cells 608B, and the cells 79 to 86 are right window cells 606. Independent of the size of the window or guard sections, the position of CUT 610 is fixed to cell 71 in shift register 602. Here d0, d1, d2 . . . d141, d142, etc., indicates the data in the cells of shift register 602 in any cycle.

An incoming sample 1 612 is loaded into the left window 604 at cell 55, and all the cell values are shifted each clock cycle. At each clock cycle, a new sample 611 enters shift register 602 at cell 0, and the samples in left window 604 shift one cell to the right. The sample in cell 63 exits left window 604 and enters guard cell 608A. The sample that enters guard cell 608A is referred to as outgoing sample 1 616. At each clock cycle, the sample in cell 75 (the rightmost cell of guard cell 608B) exits guard cell 608B and enters right window 606 at cell 79. The sample that enters right window 606 at cell 79 is referred to as incoming sample 2 614. Finally, a sample leaves cell 86 of right window 606 and exits shift register 602, or enters an invalid cell to the right of right window 606, such as cell 87. The sample that leaves right window 606 is referred to as outgoing sample 2 618.

Sorted index array 622 consists of 128 cells. Depending on the size of the window, all the cells of the sorted index array or only a few cells are valid. In this example, sorted index array 622 is used for storing the ranks of left window and right window samples of shift register 602.

After 56 clock cycles of shifting, the first incoming sample enters left window 604 of shift register 602 at cell 56. Similarly, the cells of sorted index array 622 are also shifted for 56 cycles, so that the sorted index array cells 56 to 71 are initialized with values of 1 to 16. This is done so that the sorted index array 622 and the shift register 602 are mapped to each other easily.

Figure 8B:
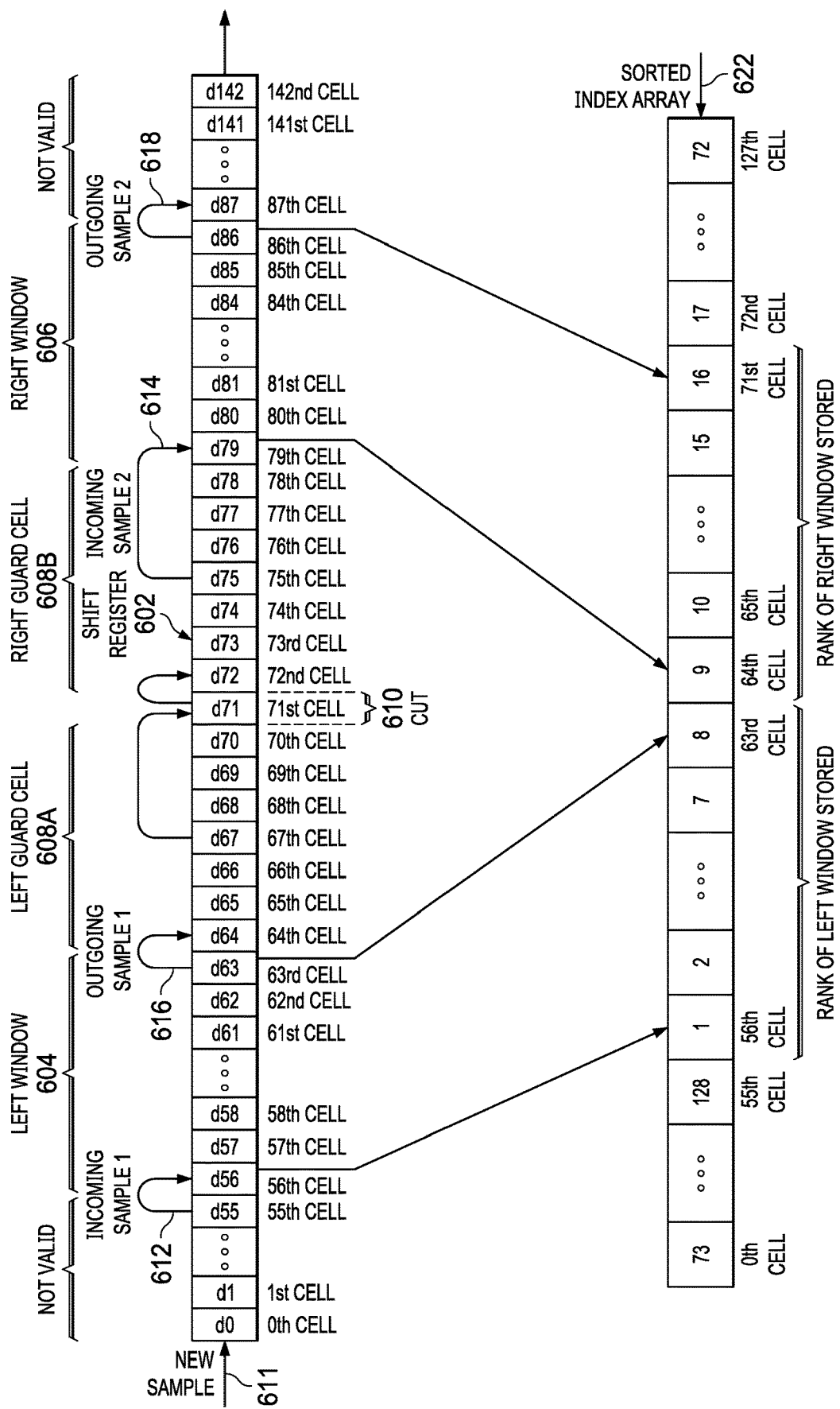
FIG. 8B is a system for shifting and initialization of a sorted index array in accordance with various examples.

FIG. 8B is a system for shifting and initialization of a sorted index array 622 in accordance with various examples. Ranks of left window 604 cells 56 to 63 of shift register 602 are stored in cells 56 to 63 of sorted index array 622. Similarly, ranks of right window 606 cells 79 to 86 of shift register 602 are stored in cells 64 to 71 of sorted index array 622, (this is because there are not ranks for CUT 610 (1 cell) and guard cells 608 (14 cells), and 79−15=64 cells).

Incoming sample 1 612 is compared with left and right window samples of shift register 602 to obtain the rank of incoming sample 1 612. The comparator outputs a value of 1, if the incoming sample 1 612 is greater than the window samples. Only the comparison results of incoming sample 1 612 with 8 valid left window cells of shift register (cells 56 to 63) and the 8 valid right window cells of shift register (cells 79 to 86) are added to compute the rank of incoming sample 1 612. For example, if the incoming sample 1 612 is greater than 5 of the valid left and right window cells, then the rank of the incoming sample 1 612 is 6 (5+1).

Incoming sample 2 614 is compared with left and right window samples of shift register 602 to obtain the rank of incoming sample 2 614. The comparator outputs the value of 1, if the incoming sample 2 614 is greater than the window samples. Only the comparison results of incoming sample 2 614 with the 8 valid left window cells of shift register (cells 56 to 63) and the 8 valid right window cells of shift register (cells 79 to 86) are added to compute the rank. For example, if the incoming sample 2 614 is greater than 9 out of 16 valid left and right window cells, then the rank of the incoming sample 2 is 10 (9+1).

At each clock cycle, the elements of sorted index array 622 are updated. For the window size of 8, only the cells 56 to 71 of the sorted index array contain valid ranks. The new computed ranks of incoming sample 1 612 and incoming sample 2 614 are inserted into cells 56 and 64 of sorted index array 622. Also, the ranks of outgoing sample 1 616 and outgoing sample 2 618 are removed; e.g., ranks from cells 63 and 71 of sorted index array 622 are removed. All other cells (except the cells containing the ranks of two incoming samples (56 and 64) and ranks of two outgoing samples (63 and 71)) of the sorted index array 622 are updated incrementally and shifted right.

At each clock cycle, the Kth ranked element from the sorted index array 622 is selected. Based on the mapping of sorted index array 622 and shift register 602, the sample from the corresponding cell in shift register 602 is selected. This sample value may then be scaled using a threshold scale 626 (shown in FIG. 6A) in some examples. The output of the threshold scale 626 is provided to a first input 630 of target comparator 628. The sample value in CUT 610 is provided to the second input 632 of target comparator 628. The output 634 of target comparator 628 indicates whether a target is detected with the sample from CUT 610. After the detection process completes, a second cycle begins and the process described above repeats for the new input samples (incoming sample 1 612 and incoming sample 2 614). The process continues until all input samples have been tested for target detection.

Figure 9:
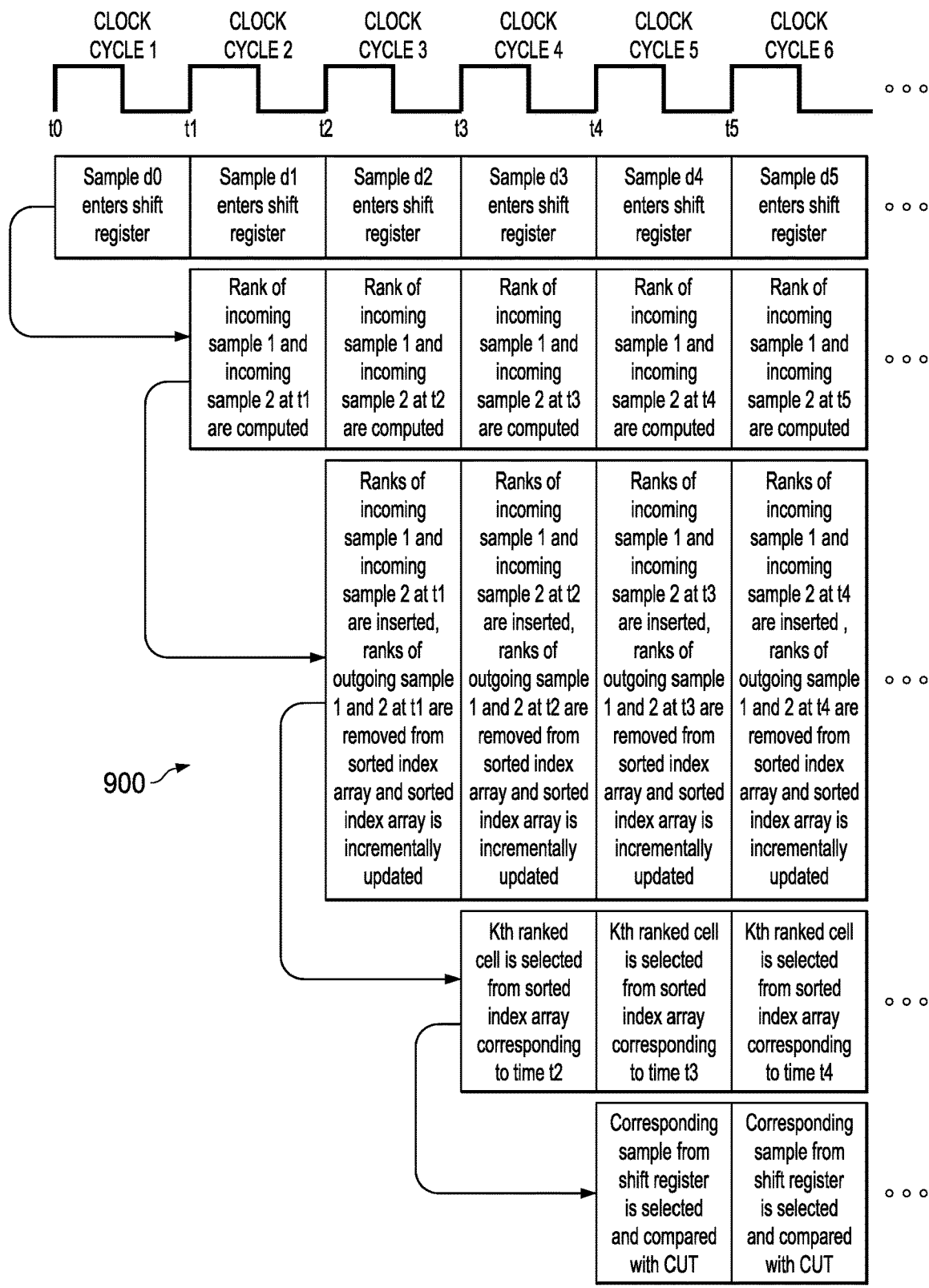
FIG. 9 is a diagram of the steps of CFAR-OS target detection in accordance with various examples.

FIG. 9 is a diagram 900 of steps for CFAR OS target detection in accordance with various examples herein. The steps of CFAR OS target detection occur in a pipelined manner in a hardware implementation, as shown in diagram 900.

At clock cycle 1, incoming sample 1 enters the shift register 602 and all the samples in shift register 602 are shifted once. At clock cycle 2, the ranks of incoming sample 1 and incoming sample 2 are computed. At clock cycle 3, the sorted index array 622 is incrementally updated and the ranks of incoming sample 1 and incoming sample 2 are inserted to sorted index array 622. The ranks of outgoing sample 1 and outgoing sample 2 are removed from sorted index array 622.

At clock cycle 4, the Kth ranked cell is selected from sorted index array 622. At clock cycle 5, a corresponding sample from shift register 602 is selected and the sample is compared with the CUT 610 to determine if CUT 610 is a target or not. By performing the operations in a pipelined manner, the hardware operates at a high frequency (such as 400 Mhz) and with a throughput of one output every cycle.

Examples described herein provide for generating valid outputs for all data samples in a CFAR-OS detection scheme, even data samples at the edges of the dataset. Also, examples described herein provide for guard intervals around a CUT to avoid leakage effects. Guard interval sizes and window sizes may also be adjusted according to various examples herein. A hardware solution for CFAR-OS may also be reconfigured as a sorter to reduce hardware area in some examples.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Unless otherwise stated, "about," "approximately," or "substantially" preceding a value means+/−10 percent of the stated value. Modifications are possible in the described examples, and other examples are possible within the scope of the claims.

What is claimed is:

1. A method, comprising:
    loading data samples of a return target detection signal into a shift register of target detection circuitry, the shift register including a cell under test (CUT) and a first number of left window cells left out of the CUT and a second number of right window cells right of the CUT, wherein, as each data sample is loaded into the shift register, previously loaded data samples are shifted by one cell, at least each of the right window cells, each of the left window cells and the CUT contains a respective data sample;
    computing a representative noise level by:
        sorting data samples from the left window cells and the right window cells to create sorted data samples that are ranked in magnitude; and
        selecting a Kth ranked data sample from among the sorted data samples as having the representative noise level, wherein a value of K is a first value when a number of valid data samples in the left and right window cells is a first number and is a second value when the number of valid data samples in the left and right window cells is a second number that is greater than the first number; and
    comparing the data sample in the CUT to the representative noise level.

2. The method of claim 1, wherein the data samples from the right window cells includes zero data samples.

3. The method of claim 1, wherein the first number of valid data samples is within a first range of valid data samples and the second number of valid data samples is within a second range of valid data samples that is greater than, and does not overlap, the first range of valid data samples.

4. The method of claim 1, wherein the shift register includes a first guard cell adjacent to the CUT and between the CUT and the left window cells, a second guard cell adjacent to the CUT and between the CUT and, the right window cells.

5. The method of claim 4, further comprising:
    at a new clock cycle, shifting a first data sample from a left window cell of the left window cells to the first guard cell, the left window cell being adjacent to the first guard cell, shifting a second data sample from the first guard cell to the CUT, and shifting a third data sample from the CUT to the second guard cell.

6. The method of claim 1, wherein:
    L represents the first number of left window cells;
    K has the first value when the first number of valid data samples equals L valid data samples in the L left window cells plus 0 to L/4l−1 valid data samples in the second number of right window cells; and
    K has the second value when the second number of valid data samples equals L valid data samples in the L left window cells plus L valid data samples in the second number of right window cells.

7. The method of claim 6, wherein:
    K has a third value when the first number of valid data samples equals L valid data samples in the L left window cells plus L/4 to 2L/4—1 valid data samples in the second number of right window cells;
    K has a fourth value when the first number of valid data samples equals L valid data samples in the L left window cells plus 2L/4 to 3L/4—1 valid data samples in the second number of right window cells; and
    K has a fifth value when the first number of valid data samples equals L valid data samples in the L left window cells plus 3L/4 to 4L/4—1 valid data samples in the second number of right window cells.

8. The method of claim 4, further comprising:
    shifting a data sample from the second guard cell to a right window cell of the right window cells at a new clock cycle, the right window cell being adjacent to the second guard cell.

9. The method of claim 1, wherein the value of K decreases from a full value used when each of the left window cells has a valid data sample to a lower value used when less than all of the left window cells has a valid data sample.

10. A method, comprising:
    shifting data samples of a return target detection signal through a shift register of target detection circuitry, wherein the shift register includes a cell under test (CUT), a first number of left window cells left of the CUT, and a second number of right window cells right of the CUT;
    computing a first rank of a first incoming data sample entering the left window cells, and computing a second rank of a second incoming data sample entering the right window cells;
    updating a sorted index array that contains respective ranks of data samples of the left and right window cells based on the first rank, the second rank, a third rank of a first outgoing data sample exiting the left window cells, and a fourth rank of a second outgoing data sample exiting the right window cells, including inserting the first rank and the second rank into positions of the sorted index array and removing the third rank and the fourth rank from positions of the sorted index array; and
    comparing the data sample in the shift register corresponding to the Kth rank in the sorted index array to a test data sample of the returned target detection signal.

11. The method of claim 10, wherein the first incoming data sample is a new data sample from the return target detection signal of a radar system.

12. The method of claim 10, wherein the second incoming data sample is a data sample from a right guard cell.

13. The method of claim 10, further comprising shifting the first outgoing data sample to a left guard cell.

14. The method of claim 10, further comprising shifting the second outgoing data sample out of the shift register.

15. The method of claim 10, further comprising selecting a value of K from the sorted index array and its corresponding value from the shift register.

16. A system, comprising:
    a shift register of target detection circuitry, the shift register configured to store data samples of a return target detection signal, wherein the shift register includes a cell under test (CUT), a left guard cell left of the CUT, a right guard cell right of the CUT, a left window left of the left guard cell, and a right window right of the right guard cell;
    a rank determining circuit, including a first set of comparators configured to compare a first incoming data samples entering the left window with data samples in the left window, each of the comparators of the first set of comparators having an input configured to receive the first incoming data sample, and a second set of comparators configured to compare a second incoming data sample exiting the right guard cell and entering the right window with data samples in the right window, each of the comparators of the second set of comparators having an input configured to receive the second incoming data sample, the rank determining circuit configured to compute ranks of the first and second incoming data samples;

a sorted index array configured to store a rank of the each of the data samples in the shift register;

a selector configured to select a Kth ranked data sample from the shift register; and a target comparator having a comparator output and first and second comparator inputs, wherein the first comparator input receives a data sample from the CUT and the second comparator input receives the Kth ranked data sample, and the comparator output indicates a CFAR target detection.

17. The system of claim 16, wherein the shift register is configured to adjust a size of the left guard cell and the right guard cell.

18. The system of claim 16, wherein the shift register is configured to adjust a size of the left window or the right window.

19. A sorter comprising:

a shift register adapted to be coupled to target detection circuitry and configured to receive and store data samples of return target detection signal, wherein the shift register includes a cell under test (CUT), a left window left of the CUT, and a right window right of the CUT, the left window and the right window being the same size, wherein each of the data samples has a magnitude value and a middle data sample among a first set of data samples is replaced by a maximum magnitude value;

two parallel sets of comparators configured to compare incoming data samples with data samples in the left window and the right window to compute ranks of the incoming data samples;

a sorted index array configured to store a rank of at least some of the data samples in the shift register;

a selector configured to select a Kth ranked index from the sorted index array and its corresponding data sample from the shift register; and a target comparator having a comparator output and first and second comparator inputs, wherein the first comparator input receives a data sample from the CUT and the second comparator input receives a Kth ranked data sample, and the comparator output indicates a CFAR target detection;

the sorter further configured to compute a rank of an input data sample and updating the ranks of data samples in the sorted index array as input data samples arrive at each cycle; and provide ranks from the sorted index array after a last input data sample enters the shift register.

20. The method of claim 3, wherein each of the first and second ranges is based on a number of valid data samples in the right window cells.

* * * * *